(12) United States Patent
Sarwar et al.

(10) Patent No.: US 11,170,858 B2
(45) Date of Patent: Nov. 9, 2021

(54) METHOD AND APPARATUS FOR ELIMINATING EEPROM BIT-DISTURB

(71) Applicant: Allegro MicroSystems, LLC, Manchester, NH (US)

(72) Inventors: Muhammad Sarwar, North Grafton, MA (US); Vyankatesh Gupta, Manchester, NH (US); James McClay, Dudley, MA (US); Sundar Chetlur, Bedford, NH (US); Harianto Wong, Southborough, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/822,119

(22) Filed: Mar. 18, 2020

(65) Prior Publication Data

US 2021/0295932 A1   Sep. 23, 2021

(51) Int. Cl.

| | | |
|---|---|---|
| *G11C 16/04* | (2006.01) | |
| *G11C 16/34* | (2006.01) | |
| *G11C 16/14* | (2006.01) | |
| *G11C 16/26* | (2006.01) | |
| *G01R 33/09* | (2006.01) | |
| *G11C 11/406* | (2006.01) | |
| *G11C 11/4074* | (2006.01) | |
| *G11C 5/05* | (2006.01) | |
| *G11C 16/08* | (2006.01) | |

(52) U.S. Cl.
CPC .......... *G11C 16/3431* (2013.01); *G01R 33/09* (2013.01); *G11C 5/05* (2013.01); *G11C 11/4074* (2013.01); *G11C 11/40626* (2013.01); *G11C 16/08* (2013.01); *G11C 16/14* (2013.01); *G11C 16/26* (2013.01)

(58) Field of Classification Search
CPC . G11C 16/3431; G11C 5/05; G11C 11/40626; G11C 11/4074; G11C 16/08; G11C 16/14; G11C 16/26; G01R 33/09
See application file for complete search history.

(56) References Cited

U.S. PATENT DOCUMENTS

| | | |
|---|---|---|
| 7,573,112 B2 | 8/2009 | Taylor |
| 7,633,115 B2 | 12/2009 | Wang |
| 7,676,914 B2 | 3/2010 | Taylor |

(Continued)

OTHER PUBLICATIONS

U.S. Non-Final Office Action dated Apr. 30, 2021 for U.S. Appl. No. 16/695,968; 13 Pages.

(Continued)

*Primary Examiner* — Tuan T Nguyen
(74) *Attorney, Agent, or Firm* — Daly, Crowley, Mofford & Durkee, LLP

(57) ABSTRACT

A method for use in a memory device including a first memory matrix is provided, the method comprising: receiving a write request that is associated with a first memory cell, the first memory cell being part of the first memory matrix; copying a content of a second memory cell into a register, the second memory cell being part of the first memory matrix; overwriting the second memory cell with the content of the register when the content of the second memory cell is different from the content of the register; and writing, to the first memory cell, at least a portion of data that is associated with the write request.

20 Claims, 6 Drawing Sheets

(56) References Cited

U.S. PATENT DOCUMENTS

| | | |
|---|---|---|
| 7,687,882 B2 | 3/2010 | Taylor et al. |
| 7,715,219 B2 | 5/2010 | Monreal |
| 8,093,670 B2 | 1/2012 | Taylor |
| 8,736,260 B2 | 5/2014 | Foletto et al. |
| 9,184,012 B2 | 11/2015 | Wang |
| 9,395,391 B2 | 7/2016 | Fernandez et al. |
| 9,476,899 B2 | 10/2016 | Fernandez et al. |
| 9,625,534 B2 | 4/2017 | Cadugan et al. |
| 9,644,999 B2 | 5/2017 | Foletto et al. |
| 10,026,478 B1 * | 7/2018 | Choi .................. G11C 13/0023 |
| 10,038,001 B1 | 7/2018 | Wang |
| 10,066,965 B2 | 9/2018 | Foletto et al. |
| 10,297,605 B2 | 5/2019 | Wang |
| 10,411,498 B2 | 9/2019 | Shoemaker et al. |
| 10,430,296 B2 | 10/2019 | Cesaretti et al. |
| 10,573,364 B1 * | 2/2020 | Sanjeevarao ........ G11C 29/021 |
| 10,635,539 B2 | 4/2020 | Cook et al. |
| 10,706,948 B2 | 7/2020 | Biberidis et al. |
| 2006/0129370 A1 | 6/2006 | Unger |
| 2007/0168718 A1 | 7/2007 | Reblewski et al. |
| 2010/0052424 A1 | 3/2010 | Taylor et al. |
| 2010/0169740 A1 | 7/2010 | Jagasivamani et al. |
| 2016/0231393 A1 | 8/2016 | Fernandez et al. |
| 2016/0247577 A1 * | 8/2016 | Lee ........................ G11C 16/10 |
| 2018/0259594 A1 | 9/2018 | Fernandez et al. |
| 2018/0267868 A1 | 9/2018 | Bose et al. |
| 2019/0370125 A1 | 12/2019 | Cesaretti et al. |
| 2019/0371415 A1 | 12/2019 | Cesaretti et al. |
| 2021/0158866 A1 * | 5/2021 | Sethuraman ........ G11C 11/5607 |

OTHER PUBLICATIONS

Response to U.S. Non-Final Office Action dated Apr. 30, 2021 for U.S. Appl. No. 16/695,968; Response filed May 3, 2021; 10 Pages.
Notice of Allowance and Issue Fee due dated May 19, 2021 for U.S. Appl. No. 16/695,968; 7 Pages.
U.S. Appl. No. 16/695,968, filed Nov. 26, 2019, Rigoni et al.
U.S. Appl. No. 16/782,139, filed Feb. 5, 2020, Sarwar et al.
U.S. Appl. No. 16/821,155, filed Mar. 17, 2020, Rigoni et al.

* cited by examiner

METHOD AND APPARATUS FOR ELIMINATING EEPROM BIT-DISTURB

BACKGROUND

Non-volatile memory is a type of memory that can retain stored information after it is powered off. Many electronic devices including, not limited to automotive sensors, automotive control systems, industrial sensors, and industrial control systems, use non-volatile memory to store data.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with aspects of the concepts described herein, it has been recognized that many electronic devices which include a non-volatile memory, including not limited to automotive sensors, automotive control systems, industrial sensors, and industrial control systems are operated under harsh thermal conditions. It has also been recognized that in some applications, the ability of non-volatile memory to endure high temperatures without experiencing failure is important (and in some instances even crucial) to the safe and reliable operation of the electronic devices.

According to aspect of the disclosure, a sensor is provided comprising: a sensing element; processing circuitry operatively coupled to the sensing element; and a memory device including a controller, a first memory matrix, and a register, wherein the controller is configured to: receive a write request from the processing circuitry, the write request identifying a first memory cell in the first memory matrix where data associated with the write request is desired to be stored; copy a content of a second memory cell into the register, the second memory cell being part of the first memory matrix; erase the first memory cell after the content of the second memory cell is copied into the register; compare the content of the second memory cell to a content of the register to detect whether erasing the first memory cell has caused the content of the second memory cell to change; overwrite the second memory cell with the content of the register when erasing the first memory cell has caused the content of the second memory cell to change; and write, to the first memory cell, at least a portion of the data associated with the write request.

According to aspects of the disclosure, an apparatus is provided, comprising: a register; a first memory matrix including a first memory cell and a second memory cell; and a controller that is operatively coupled to the first memory matrix and the register, the controller being configured to: receive a write request that is associated with the first memory cell; copy a content of the second memory cell into the register, erase the first memory cell after the content of the second memory cell is copied into the register, compare the content of the second memory cell to a content of the register after the first memory cell is erased; overwrite the second memory cell with the content of the register when the content of the second memory cell is different from the content of the register, and write, to the first memory cell, at least a portion of data that is associated with the write request.

According to aspects of the disclosure, a method for use in a memory device is provided including a first memory matrix, the method comprising: receiving a write request that is associated with a first memory cell, the first memory cell being part of the first memory matrix; copying a content of a second memory cell into a register, the second memory cell being part of the first memory matrix; overwriting the second memory cell with the content of the register when the content of the second memory cell is different from the content of the register; and writing, to the first memory cell, at least a portion of data that is associated with the write request.

BRIEF DESCRIPTION OF THE DRAWINGS

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1A:
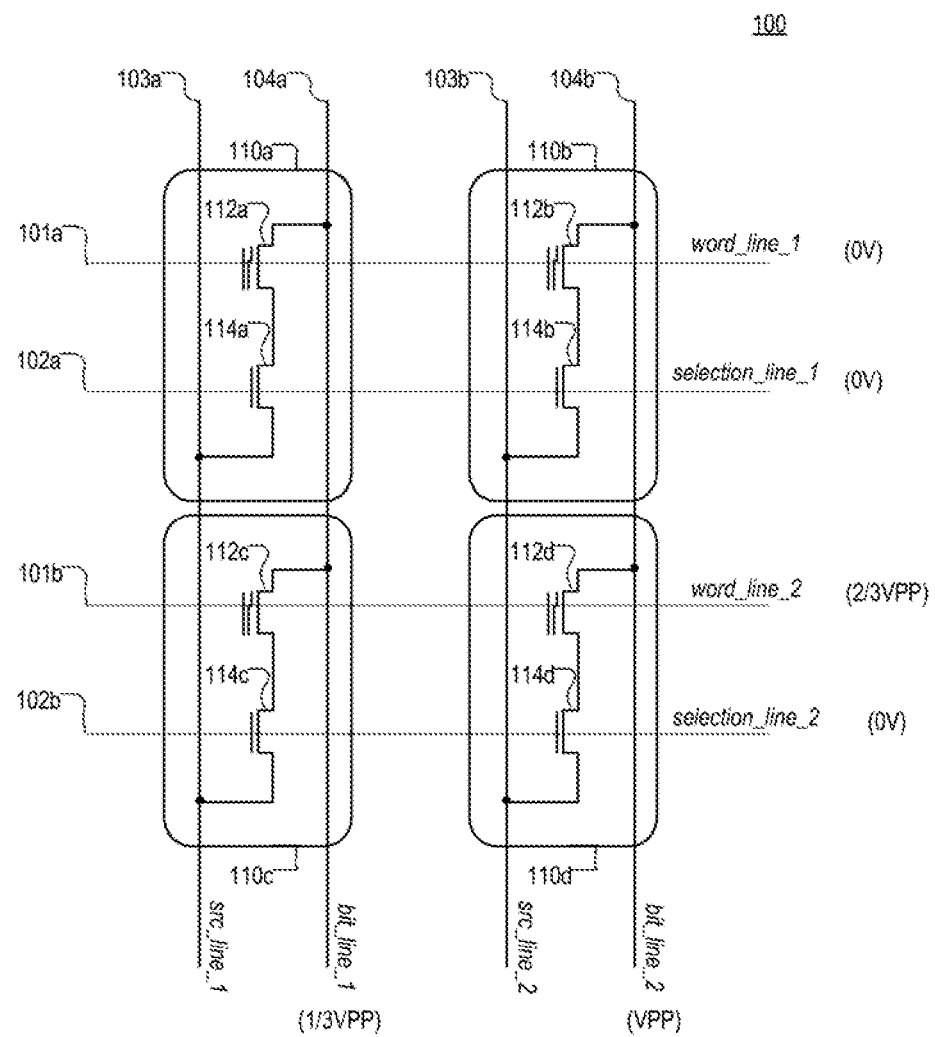
FIG. 1A is a diagram of an example of a memory matrix, according to aspects of the disclosure.

According to aspects of the disclosure, an electrically erasable programmable read-only Memory (EEPROM) device is disclosed that is configured to reduce (and ideally minimize and/or prevent) the occurrence of bit-disturb conditions within the EEPROM device. A bit-disturb condition occurs when a threshold voltage of an unselected cell (in an EEPROM device) changes during the programming of another cell. The threshold voltage of the cell may be the minimum gate-to-source voltage that is needed to create a conducting path between the source and drain terminals of a floating gate transistor that is part of the cell. The change may cause the threshold voltage of the unselected cell to have an insufficient margin for reliable reading, which in turn could result in errors when data stored in the EEPROM device is attempted to be retrieved. In other words, the presence of one or more bit-disturb conditions in the EEPROM device may cause the EEPROM device to malfunction and provide incorrect data as a result.

In some implementations, the EEPROM device may be configured to detect and ameliorate bit-disturb conditions by using a shadow register. In operation, when data is stored in the EEPROM device, the EEPROM device may include: (i) one or more first memory cells where the data is desired to be stored, and (ii) one or more second memory cells which might experience a bit-disturb condition as a result of the data being stored in the first memory cells. The EEPROM device may copy the contents of the second memory cells into the shadow register. The EEPROM device may store the data into the first memory cells. The EEPROM device may compare the contents of the second memory cells to the contents of the shadow registers to detect whether the contents of the second "memory cells" has changed as a result of the data being written to the first memory cells. If the contents of the shadow register differ from the contents of the second memory cells, a bit-disturb condition is detected, and the second memory cells are overwritten with the contents of the shadow register. Overwriting the second memory cells in this way effectively restores the second memory cells to the state which they were in prior to the occurrence of the bit-disturb condition—i.e., prior to writing the data to the first memory cells.

In some implementations, to prevent the occurrence of bit-disturb conditions, the EEPROM device may optionally be implemented in an architecture including a first memory matrix and a second memory matrix. The first memory matrix may be provided with a first row driver and a first column driver, and the second memory matrix may be provided with a second row driver and second column driver. In some respects, providing the memory matrixes with different column drivers may result in an improved electrical insulation between the first memory matrix and the second memory matrix.

A bit-disturb condition may occur when erased non-selected cells in an EEPROM matrix become programmed while cells on another row are being erased. In general, when an erase operation is performed in an EEPROM matrix, a VPP voltage (e.g., see FIG. 1A) is applied to a column line of the matrix, while the row line of non-selected memory cells that share the same column line is kept at GND voltage. In this regard, providing separate column drivers for the two memory matrices would cause the memory cells in one of the memory matrices to be better insulated from the application of VPP voltage, when an erase operation is being carried (e.g., at high temperature) in the other one of the memory matrices, thus preventing the occurrence of a bit disturb condition in the former memory matrix.

In some implementations, when the EEPROM device is used in a sensor (e.g., see FIG. 2), the first memory matrix may be used to store factory data and the second memory matrix may be used to store user data. The factory data may include clock trim codes, bias current trims, a lot number, a wafer id, and or any other suitable type of data that may be stored in the memory of a sensor when the sensor is manufactured (e.g., before the sensor leaves the factory). By contrast, the user data may include any data that is generated throughout operation of the sensor (e.g., after the sensor has left the factory). Separating the factory data and the user data in different memory matrices may help improve the reliability of the sensor by reducing the likelihood that a bid-disturb condition would corrupt the factory data when user data is being stored and/or erased from the second memory matrix. In some respects, integrating the EEPROM device into sensors is advantageous because it may help improve the reliability of the sensors.

FIG. 1A is a diagram of an example of a portion of a memory matrix 100, according to aspects of the disclosure. As illustrated, the memory matrix 100 may include a plurality of memory cells, here four memory cells 110a-110d, that are arranged along word lines 101, selection lines 102, source lines 103, and bit lines 104. Each of memory cells 110a-d may include a respective floating gate transistor 112 and a respective selection transistor 114, as shown.

More particularly, the memory cell 110a may include a floating gate transistor 112a and a selection transistor 114a, wherein the source of the floating gate transistor 112a is coupled to the drain of the selection transistor 114a. The memory cell 110b may include a floating gate transistor 112b and a selection transistor 114b, wherein the source of the floating gate transistor 112b is coupled to the drain of the selection transistor 114b. The memory cell 110c may include a floating gate transistor 112c and a selection transistor 114c, wherein the source of the floating gate transistor 112c is coupled to the drain of the selection transistor 114c. The memory cell 110d may include a floating gate transistor 112d and a selection transistor 114d, wherein the source of the floating gate transistor 112d is coupled to the drain of the selection transistor 114d.

The memory cells 110a-d may be arranged in rows along the word lines 101a-b and the selections lines 102a-b, as shown. More particularly, memory cells 110a and 110b may be arranged in one row, and memory cells 110c and 110d may be arranged in a different row. As a result of this arrangement, the gates of floating gate transistors 112a and 112b may be coupled to word line 101a, and the gates of selection transistors 114a and 114b may be coupled to selection line 102a. Similarly, the gates of floating gate transistors 112c and 112d may be coupled to word line 101b, and the gates of selection transistors 114c and 114d may be coupled to selection line 102b.

The memory cells 110a-d may be arranged in columns along the source lines 103a-b and the bit lines 104a-b, as shown. More particularly, memory cells 110a and 110c may be arranged in one column, and memory cells 110b and 110d may be arranged in a different column. As a result of this arrangement, the drains of floating gate transistors 112a and 112c may be coupled to bit line 104a, and the sources of selection transistors 114a and 114c may be coupled to source line 103a. Similarly, the drains of floating gate transistors 112b and 112d may be coupled to bit line 104b, and the sources of selection transistors 114b and 114d may be coupled to source line 103b.

The memory matrix 100 is susceptible to experiencing a bit-disturb condition when data is written to the memory cells 110. Consider an example in which new data is written to memory cell 110b. In order to write the new data, the memory cell 110b must be first erased (e.g., reset), and then programmed with the new data. Erasing the memory cell 110b can be achieved by: (i) applying 0 volts at word line 101a, applying 0 volts at selection line 102a, (iii) applying VPP volts at bit line 104b, (iv) applying ⅓VPP volts on bit line 104a, and (v) applying ⅔VPP volts at word line 101b, where VPP is a high driving voltage for the memory matrix 100, and ⅓VPP and ⅔VPP are respective fractions of the high driving voltage.

When the memory cell 110b is erased, non-erased memory cells in the memory matrix 100 may experience a bit-disturb condition. In this example, non-erased memory cells (e.g., memory cell 110d) that are located on the same bit line as the erased memory cell (e.g., memory cell 110b) may be at a higher risk of experiencing a bit-disturb condition than other cells in the memory matrix. A bit-disturb condition may manifest itself when non-erased cells are programmed as a result of repeated VPP exposure.

In accordance with the concepts sought to be protected herein, it has been recognized that the likelihood of non-erased cells becoming programmed is increased when the memory matrix 100 is exposed to high temperatures. More particularly, when a non-erased cell is exposed to high temperatures, trapped charges in the oxide of the cell's floating gate transistor may gain (and may be more likely to gain) enough kinetic energy to escape the potential barrier and arrive at the floating gates of the floating gate transistor. This process may eventually increase the threshold voltage of the floating gate transistor, causing the non-erased cell to become programmed. According to the present example, the term "non-erased cells" is used to refer to cells that are not being erased concurrently with memory cell 110b and/or memory cells that are not desired to be erased when the memory cell 110b is being erased. According to the present disclosure, what constitutes a "high temperature" may depend on the specific implementation and performance parameters of the memory matrix 100, and it can be readily determined by those of ordinary skill in the art.

Although in the example of FIG. 1A the memory matrix 100 is a 2×2 matrix, it will be understood that the present disclosure is not limited to any set of dimensions for the memory matrix 100. Thus, the concepts described herein apply to any n×m matrix where n and m are integers greater than zero. Although in the example of FIG. 1A the memory matrix 100 includes four memory cells, it will be understood that the memory matrix 100 may include any number of memory cells. Although in the example of FIG. 1A the memory matrix 100 includes two bit lines, it will be understood that the memory matrix 100 may include any number of bit lines. Although in the example of FIG. 1A the memory matrix 100 includes two word lines, it will be understood that the memory matrix 100 may include any number of word lines. Stated succinctly, the present disclosure is not limited to any specific configuration of the memory matrix 100.

Figure 1B:
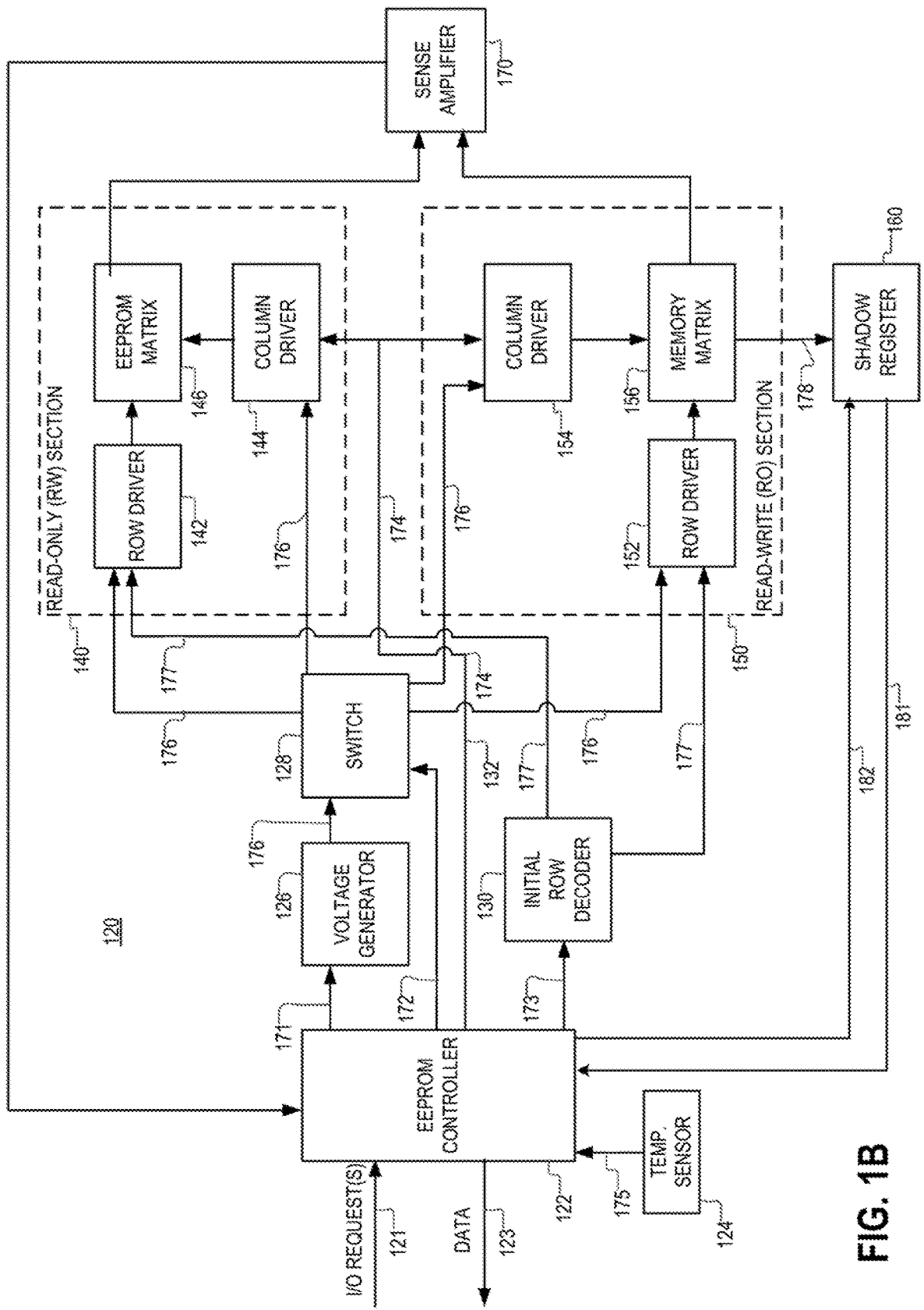
FIG. 1B is a diagram of an example of a memory device, according to aspects of the disclosure.

FIG. 1B is a diagram of an example of a memory device 120 according to aspects of the disclosure. As illustrated, the memory device 120 may include a controller 122, a temperature sensor 124, a voltage generator 126, a switch 128, an initial row decoder 130, a secondary column driver 132, a sense amplifier 170, a read-only (RO) section 140, a read-write (RW) section 150, and a shadow register 160. The RO section 140 may include a row driver 142, a column driver 144, and a memory matrix 146. The RW section 150 may include a row driver 152, a column driver 154, and a memory matrix 156.

The controller 122 may include an EEPROM controller and/or any other suitable type of memory controller. The temperature sensor 124 may include any suitable type of temperature sensor. The voltage generator 126 may include any suitable electronic circuitry for generating voltage signals for driving the memory matrices 146/144. The switch 128 may include any suitable type of electronic circuitry for routing voltage signals generated by the voltage generator 126 to one of the RO section 140 and the RW section 150. The initial row decoder 130 may include any suitable type of electronic circuitry that is configured to receive an address, and route the address to one of the RO section 140 and the RW section 150. The sense amplifier 170 may include any suitable type of amplifier for amplifying signals that are received from the memory matrices 146/144, and supplying the amplified signals to the controller 122.

The RO section 140 may include a row driver 142, a column driver 144, and a memory matrix 146. The memory matrix 146 may include any suitable type of non-volatile memory matrix. Additionally or alternatively, in some implementations, the memory matrix 146 may include an EEPROM matrix. Additionally or alternatively, in some implementations, the memory matrix 146 may be the same or similar to the memory matrix 100, which is discussed above with respect to FIG. 1A.

The RW section 150 may include a row driver 152, a column driver 154, and a memory matrix 156. The memory matrix 156 may include any suitable type of non-volatile memory matrix. Additionally or alternatively, in some implementations, the memory matrix 156 may include an EEPROM matrix. Additionally or alternatively, in some implementations, the memory matrix 156 may be the same or similar to the memory matrix 100, which is discussed above with respect to FIG. 1A.

The shadow register 160 may include any suitable type of volatile memory. According to the present example, the shadow register is the same size as the memory matrix 156. However, alternative implementations are possible in which the shadow register 160 is either smaller or larger than the memory matrix 156. For example, in some implementations, the shadow register 160 may be 1-bit wide or 1-word wide, etc. Although in the example of FIG. 1B the shadow register 160 includes volatile memory, alternative implementations are possible in which the shadow register includes non-volatile memory.

The controller 122 may be configured to output control signals 171-174 to different components of the memory device 120. Specifically, the controller 122 may output a control signal 171 to the voltage generator 126. Additionally or alternatively, in some implementations, the controller 122 may be further configured to output a control signal 172 to the switch 128. Additionally or alternatively, in some implementations, the controller 122 may be further configured to output a control signal 173 to the initial row decoder 130. Additionally or alternatively, in some implementations, the controller 122 may be further configured to output a control signal 174 to the RO section 140 and the RW section 150. Additionally or alternatively, in some implementations, the controller may be further configured to output a control signal 182 (e.g., a read/write signal) to the shadow register 160

The controller 122 may be further configured to receive a temperature signal 175 from the temperature sensor 124. In operation, the controller 122 may sample the temperature signal 175 to obtain one or more temperature readings. Each of the temperature readings may identify the current temperature of the memory device 120. Furthermore, in some implementations, the controller 122 may be configured to receive, from the shadow register 160, data 181 that is stored in the shadow register 170. The data 181 may be provided to the controller 122 in response to the control signal 181.

The shadow register 160 may be configured to receive a control signal 182 from the controller 122. When the control signal 182 has a first value, the shadow register 160 may provide data 181 (that is stored in the shadow register 160) to the controller 122. When the control signal 182 has a second value, the shadow register 160 may store data 178 that is provided to the shadow register 160 by the memory matrix 156.

The voltage generator 126 may receive the control signal 171 and generate a voltage signal 176 based on the control signal 171. The voltage signal 176 may be supplied to the switch 128, as shown. The switch 128 may receive the voltage signal from 176 and the control signal 172. Based on the control signal 172, the switch 128 may route the voltage signal 176 to one of the RO section 140 and the RW section 150. Specifically, when the control signal 172 has a first value, the switch 128 may route the voltage signal 176 to the row driver 142 and the column driver 144 of the RO section 140. Otherwise, if the control signal 172 has a second value, the switch 128 may route the voltage signal 176 to the row driver 152 and the column driver 154 of the RW section 150.

The initial row decoder 130 may receive the control signal 173 from the controller 122. The control signal 173 may include a memory matrix identifier and an address. The memory matrix identifier may be a bit selecting one of the RO section 140 and the RW section 150. Based on the control signal 173, the initial row decoder 130 may generate an address signal 177 which contains the address (provided with the control signal 173). After the address signal 177 is generated, the initial row decoder 130 may route the address signal 177 to one of the RO section 140 and the RW section 150 based on the memory matrix identifier (which is also provided with the control signal 173). For example, if the memory matrix identifier has a first value, the initial row decoder 130 may route the address signal 177 to the RO section 140. Otherwise, if the memory matrix identifier has a second value, the row decoder may route the address signal 177 to the RW section 150.

Turning to the operation of the RO section 140, the row driver 142 may receive the voltage signal 176 and the control signal 174. Based on the address signal 177 and the voltage signal 176, the row driver 142 may apply voltages to different word lines and selection lines of the memory matrix 146 in a well-known fashion. The column driver 144 may receive the voltage signal 176 and the control signal 174. Based on the control signal 174 and the voltage signal 176, the column driver 144 may apply voltages to different source lines and bit lines of the memory matrix 146 in a well-known fashion (to perform a read or a write operation).

Turning to the operation of the RW section 150, the row driver 152 may receive the voltage signal 176 and address signal 177. Based on the address signal 177 and the voltage signal 176, the row driver 152 may apply voltages to different word lines and selection lines of the memory matrix 156 in a well-known fashion. The column driver 154 may receive the voltage signal 176 and the control signal 174. Based on the control signal 174 and the voltage signal 176, the column driver 154 may apply voltages to different source lines and bit lines of the memory matrix 156 in a well-known fashion (to perform a read or a write operation).

According to aspects of the disclosure, the controller 123 may be configured to execute a process for preventing the occurrence of bit-disturb conditions in the memory matrices 146/156. Specifically, the controller 123 may configured to receive a write request 121. Next, the controller may receive a temperature reading by using the temperature sensor 124. If the temperature reading indicates that the temperature of the memory device 120 is below a threshold, the controller 123 may execute the read request in a "normal mode." Otherwise, if the temperature reading indicates that the temperature of the memory device 120 is above the threshold, the controller 122 may execute the write request in a "shadow mode."

Executing a write request in a shadow mode may include: (i) moving at least some of the contents of the memory matrix 156 into the shadow register 160 before the write request is executed, and (ii) comparing the contents of the shadow register with the contents of the memory matrix 156 after the write request is executed to determine whether the contents of the memory matrix 156 has been corrupted as a result of a bit-disturb condition that is triggered by the execution of the write request. If the contents of the memory matrix 156 is deemed corrupt, the memory matrix 156 is overwritten with the contents of the shadow register, causing the memory matrix 156 be returned to its original (uncorrupted) state.

Executing a write request in a normal mode includes steps which are normally performed when data is stored in a memory matrix. According to the present example, when a write request is executed in normal mode, the contents of the memory matrix 156 is not copied into the shadow register, and no comparison is performed between the contents of the memory matrix 156 and the shadow register 160 after the write request is completed.

Figure 2:
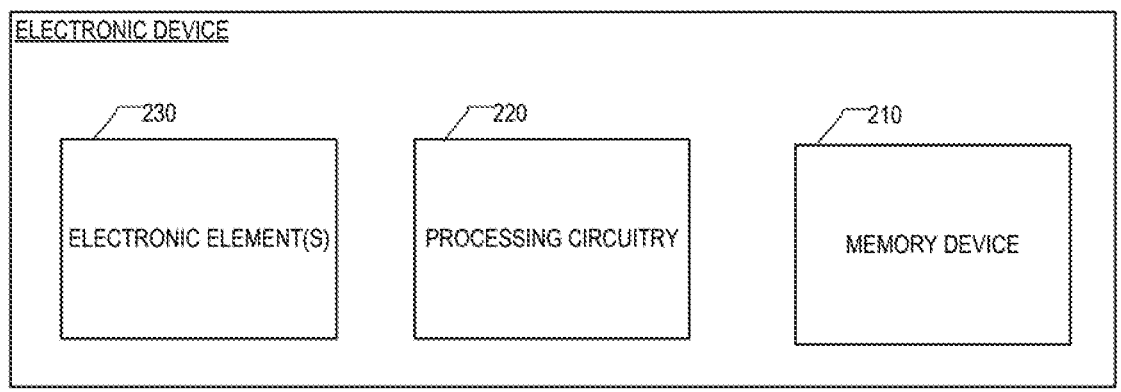
FIG. 2 is a diagram of an example of a sensor, according to aspects of the disclosure.

FIG. 2 is a diagram of an example of an electronic device 200 (e.g. a sensor), according to aspects of the disclosure. The electronic device 200 may include a memory device 210, a processing circuitry 220, and one or more electronic elements 230 which collect information internal or external to the electronic device 200. The memory device 210 may be the same or similar to the memory device 120. The processing circuitry 220 may include any suitable type of processing circuitry that is configured to obtain digitized samples of signal(s) generated by the electronic elements 230 and process those signals to generate one or more output signals. To generate the output signals, the processing circuitry 220 may repeatedly read and write data to the memory device 210.

In the case in which the electronic device 200 is a sensor, the one or more electronic elements 230 may be provided as one or more sensing elements which may include a Hall effect element, a magnetoresistive element (MRE), a temperature sensing element, a pressure sensing element, a photodiode, and/or any other suitable type of transducer. In this regard, the sensor 200 may include a magnetic angle sensor, a current sensor, a temperature sensor, a pressure sensor, an optical sensor, and/or any other suitable type of sensor. Stated succinctly, the memory device 210 (and/or the memory device 120) is not limited to being in used conjunction with any specific type of sensor. Moreover, as noted above, bit-disturb conditions are more likely to occur at high temperatures. In this regard, integrating the memory device 120 into sensors may help improve the reliability of such sensors when the sensors are subjected to high temperatures.

Figure 3:
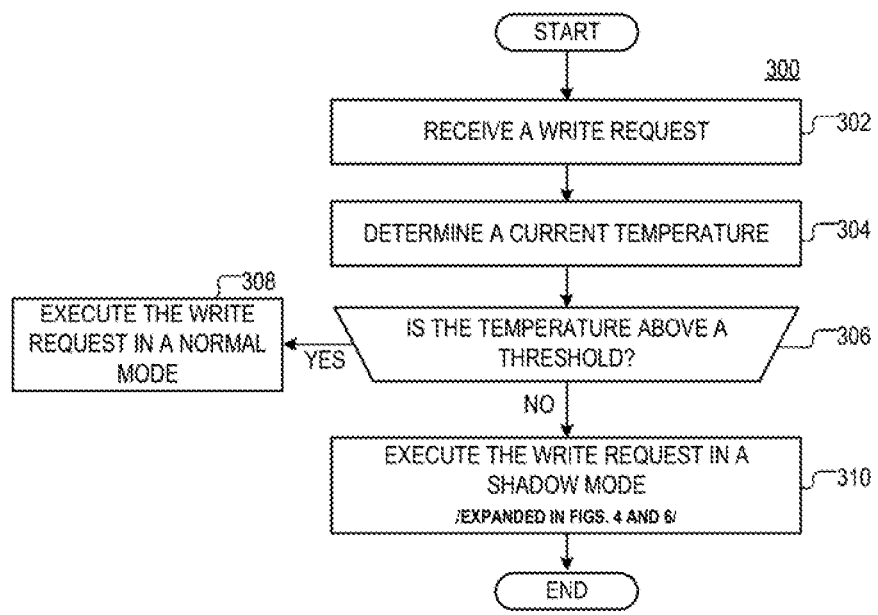
FIG. 3 is a flowchart of an example of a process, according to aspects of the disclosure.

FIG. 3 is a flowchart of an example of a process 300 for storing data in a memory device, wherein the memory device includes a memory matrix and a shadow register. At step 302, a write request is received at the memory device. The write request may specify an address where data associated with the write request is desired to be stored. At step 304, the current temperature of the memory device is determined. At step 306, a determination is made if the current temperature of the memory device meets a threshold temperature (e.g., 80C). If the temperature of the memory device fails to meet the threshold temperature (e.g., if the temperature is less than the threshold, etc.), the process 300 proceeds to step 308. Otherwise, if the temperature of the memory device meets the threshold (e.g., if the temperature is greater than the threshold, etc.), the process 300 proceeds to step 310. At step 308, the write request is executed in a normal mode. At step 310, the write request is executed in a shadow mode.

Figure 4:
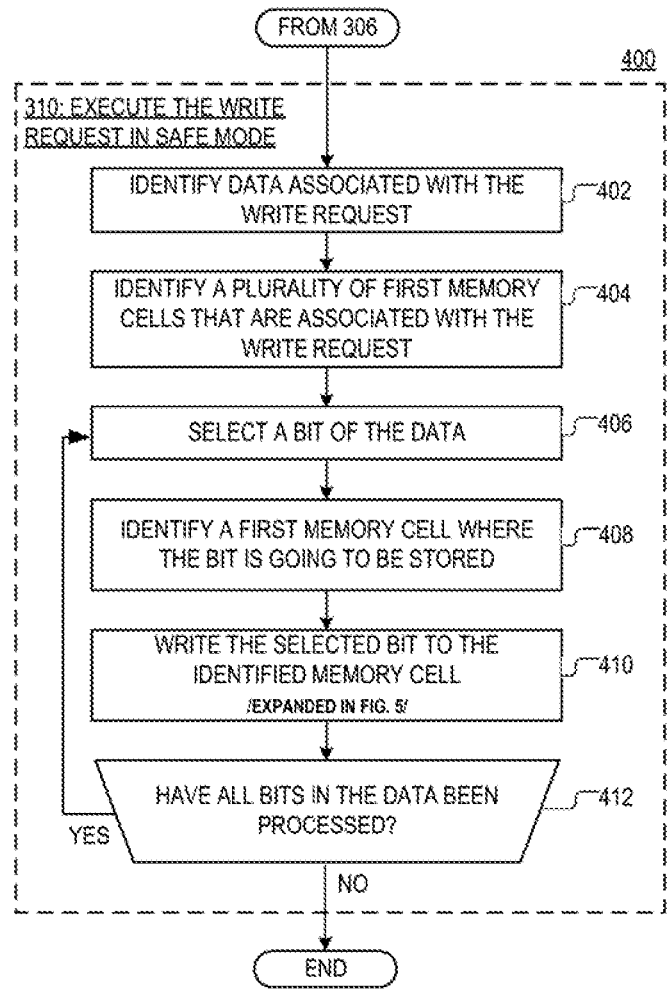
FIG. 4 is a flowchart of an example of a process, according to aspects of the disclosure.

FIG. 4 is a flowchart of an example of a process 400 for executing a write request in a shadow mode (e.g., as illustrated by step 310 of the process 300). At step 402, the data associated with the write request is identified. At step 404, a plurality of first memory cells (in the memory matrix) are identified that are associated with the address (specified by the write request). At step 406, a bit of the data is selected. At step 408, one of the first memory cells is selected. At step 410, the selected bit of data is stored in the selected memory cell. At step 412, a determination is made if all bits in the data have been processed. If there are bits that remain to be processed, the process 400 returns to step 406, and steps 406-412 are repeated for another bit of the data, which has not been processed yet. Otherwise, if there are no more bits that remain to be processed, the process 400 ends.

Figure 5:
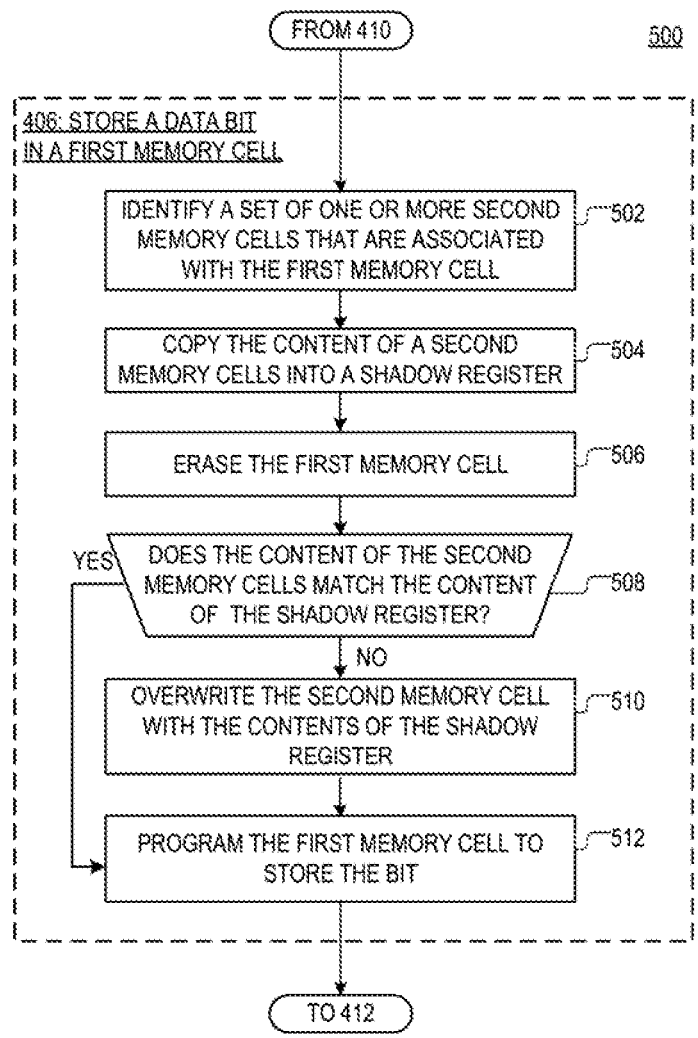
FIG. 5 is a flowchart of an example of a process, according to aspects of the disclosure.

FIG. 5 is a flowchart of an example of a process 500 for writing a data bit to a first memory cell, as specified by step 410 of the process 400. At step 502, one or more second memory cells are identified that are associated with the first memory cell. At step 504, the content of the second memory cells is copied into the shadow register. At step 506, the first memory cell is erased. As noted above, erasing the first memory cell may cause a bit-disturb condition to appear in the second memory cells (i.e., it may cause the bits in one or more of the memory cells to flip). At step 508, the content of the second memory cells is compared to the content of the shadow register. If the content of the shadow register differs from the content of the second memory cells, the process 500 proceeds to step 510. Otherwise, if the content of the shadow register is the same as the content of the second memory cells, the process 500 proceeds to step 512. At step 510, the second memory cells are overwritten with the content of the shadow register. At step 512, the first memory cell is programmed to store the data bit.

As can be readily appreciated, the content of the second memory cells is expected to be the same as the content of the shadow register, unless a bit-disturb condition has occurred in the second memory cells when the first memory cell is erased. In this regard, comparing the content of the shadow register to the content of the second memory cells may identify the presence of bit-disturb condition(s) in the second memory cells. Overwriting the second memory cells with the content of the shadow register may restore the second memory cells to the state they were in prior the occurrence of the bit-disturb condition(s), thus rectifying the effect of the bit disturb condition(s). According to aspects of the disclosure, overwriting the second memory cells with the content of the shadow register may include erasing (e.g., resetting, etc.) the second memory cells and subsequently programming the second memory cells to store the data that is present in the shadow register.

According to aspects of the disclosure, the second memory cells may include one or more memory are cells that are situated in the same column of the memory matrix as the first memory cell. However, it will be understood that the present disclosure is not limited to any specific method for selecting the second memory cells. For example, the second memory cells may include memory cells that are situated in any column of the memory matrix. Additionally or alternatively, the second memory cells may include memory cells that are in the same row as the first memory cell. Additionally or alternatively, in some implementations, the second memory cells may include memory cells in any row of the memory matrix.

Figure 6:
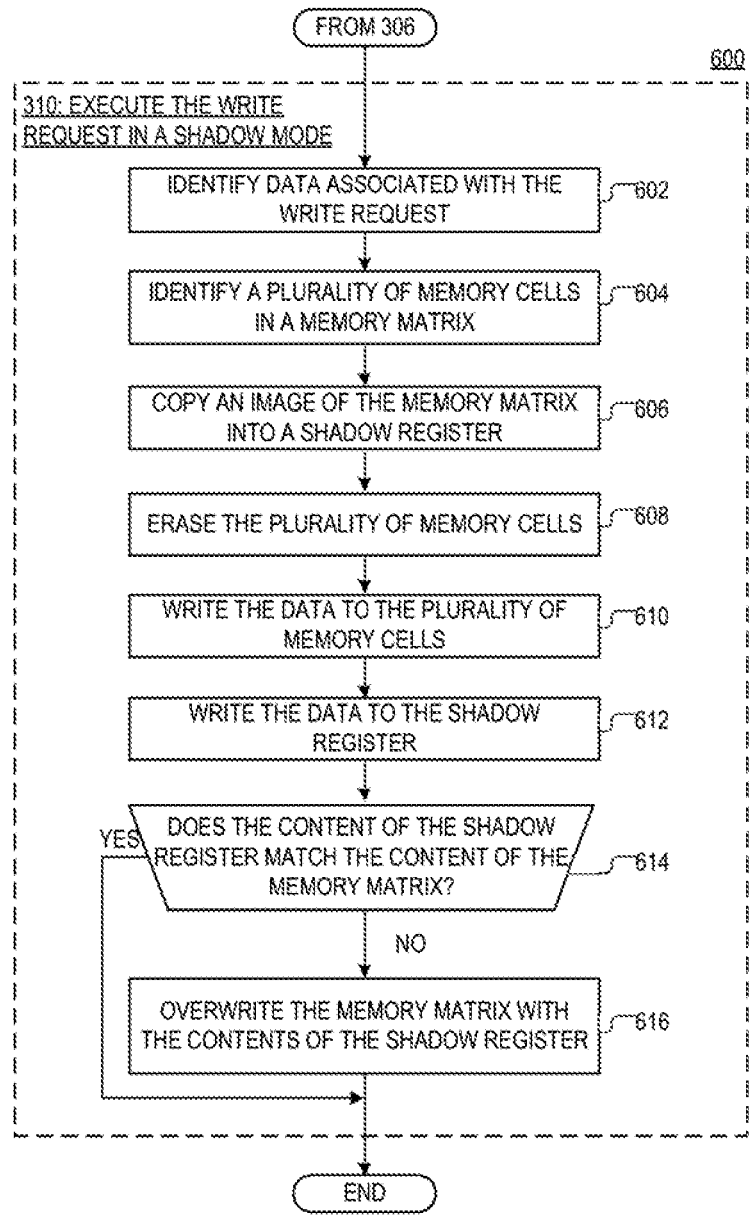
FIG. 6 is a flowchart of an example of a process, according to aspects of the disclosure.

FIG. 6 is a flowchart of an example of a process 600 for executing a write request in a shadow mode, as specified by step 310 of the process 300. At step 602, data associated with the write request is identified. At step 604, a plurality of memory cells (in the memory matrix) are identified that are associated with the address specified by the write request. At step 606, an image of the memory matrix is copied into a shadow register. At step 608, the identified memory cells are erased. As noted above, erasing the memory cells may cause a bit-disturb condition to appear in the memory matrix (i.e., it may cause one or more bits in the memory matrix to flip). At step 610, the memory cells are programmed to store the data associated with the write request. At step 612, the data associated with the request is stored in the shadow register at a location that corresponds to the address specified by the write request. At step 614, the content of the shadow register is compared to the content of the memory matrix. When the content of the shadow register is the same as the content of the memory matrix, the process 600 ends. Otherwise, when the content of the memory matrix is different from the content of the shadow register, the process 600 proceeds to step 616. At step 616, the shadow register is overwritten with the content of the memory matrix. Overwriting the memory matrix with the content of the shadow register may include erasing (e.g., resetting, etc.) all memory cells in the memory matrix and programming the memory cells in the memory matrix to store the data that is present in the shadow register.

As can be readily appreciated, the content of the memory matrix is expected to be the same as the content of the shadow register, unless a bit-disturb condition has occurred in the memory matrix when the plurality of data cells is erased. In this regard, comparing the content of the shadow register to the content of the memory matrix may identify the presence of bit-disturb condition(s) in the second memory cells. Overwriting the memory matrix with the content of the shadow register may restore the second memory cells to the state they were in prior the occurrence of the bit-disturb condition(s), thus rectifying the effect of the bit disturb condition(s).

In some implementations, copying the image of the memory matrix into the shadow register (at step 606) may include copying the entire content of the memory matrix into the shadow register. Additionally or alternatively, in some implementations, the shadow register may be divided into a plurality of portions, wherein each portion corresponds to a different address in the logical address space of the memory matrix. In such implementations, copying the image of the memory matrix to the shadow register may include copying data that is stored at each of the addresses in the memory matrix to the address's corresponding portion of the shadow register. In this regard, the portion of the shadow register, which is associated with the address specified by the write request, may include a portion of the shadow register where the content of the plurality of memory cells (identified at step 604) is copied (at step 606) prior to the plurality of memory cells being erased (at step 608).

In some implementations, the memory device discussed with respect to FIGS. 3-6 may be the same or similar to the memory device 120, which is discussed above with respect to FIG. 1B. Additionally or alternatively, in some implementations, the memory matrix discussed with respect to FIGS. 3-6 may be the same or similar to the memory matrix 156, which is discussed above with respect to FIG. 1B. Additionally or alternatively, in some implementations, the shadow register discussed with respect to FIGS. 3-6 may be the same or similar to the shadow register 160, which is discussed above with respect to FIG. 1B. Although in the example of FIGS. 4-5, bits of the data associated with a write request are written serially to the memory matrix, it would be understood that alternative implementations are possible in which the data bits are written in parallel with one another, by executing multiple instances of the process 500 concurrently with one another.

FIGS. 1-6 are provided as an example only. At least some the steps described in these figures can be performed in parallel, in a different order, or altogether omitted. Although the examples discussed with respect to FIGS. 1-6 describe that certain actions are performed by setting signals to a logic high value, it will be understood that alternative implementations are possible in which the same actions are driven by setting the signals to a logic low value. Although some of the process(es) described throughout the disclosure are executed concurrently with the servicing of read requests, alternative implementations are possible in which the process(es) are executed independently of the servicing of any read requests.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A sensor comprising:
a sensing element;
processing circuitry operatively coupled to the sensing element; and
a memory device including a controller, a first memory matrix, and a register, wherein the controller is configured to:
receive a write request from the processing circuitry, the write request identifying a first memory cell in the first memory matrix where data associated with the write request is desired to be stored;
copy a content of a second memory cell into the register, the second memory cell being part of the first memory matrix;
erase the first memory cell after the content of the second memory cell is copied into the register;
compare the content of the second memory cell to a content of the register to detect whether erasing the first memory cell has caused the content of the second memory cell to change;
overwrite the second memory cell with the content of the register when erasing the first memory cell has caused the content of the second memory cell to change; and
write, to the first memory cell, at least a portion of the data associated with the write request.

2. The sensor of claim 1, wherein the first memory matrix includes an electrically erasable programmable read-only (EEPROM) matrix, and the first and second memory cells are part of a same row in the first memory matrix.

3. The sensor of claim 1, wherein the sensing element includes at least one of: a Hall effect element; and a magnetoresistive element.

4. The sensor of claim 1, further comprising a temperature-sensing device, wherein:
the controller of the memory device is configured to detect a temperature of the sensor via the temperature-sensing device, and
the content of the second memory cell is copied into the register only when the temperature of the sensor exceeds a predetermined threshold temperature.

5. The sensor of claim 1, wherein:
the memory device further includes a second memory matrix,
the first memory matrix is configured to store user data, and
the second memory matrix is configured to store factory data.

6. The sensor of claim 5, wherein:
the memory device includes a row decoder, a first row driver, and a second row driver,
the first row driver is configured to control the first memory matrix,
the second row driver is configured to control the second memory matrix, and
the row decoder is configured to receive an address signal from the controller and provide at least a portion of the address signal to one of the first row driver and the second row driver based on a matrix identifier that is provided with the address signal.

7. The sensor of claim 5, wherein:
the memory device includes a first row driver, a second row driver, a switch, and a voltage source that is operatively coupled to the first row driver and the second row driver via the switch,
the first row driver is configured to control the first memory matrix,
the second row driver is configured to control the second memory matrix, and
the switch is configured to receive a control signal from the controller and provide a voltage signal provided by the voltage source to one of the first row driver and the second row driver based on the control signal.

8. An apparatus, comprising:
a register;
a first memory matrix including a first memory cell and a second memory cell; and
a controller that is operatively coupled to the first memory matrix and the register, the controller being configured to:
receive a write request that is associated with the first memory cell;
copy a content of the second memory cell into the register;
erase the first memory cell after the content of the second memory cell is copied into the register;
compare the content of the second memory cell to a content of the register after the first memory cell is erased;
overwrite the second memory cell with the content of the register when the content of the second memory cell is different from the content of the register; and
write, to the first memory cell, at least a portion of data that is associated with the write request.

9. The apparatus of claim 8, wherein the first memory matrix includes an electrically erasable programmable read-only (EEPROM) matrix, and the first and second memory cells are part of the same row in the first memory matrix.

10. The apparatus of claim 8 further comprising a sensing element, wherein the sensing element includes at least one of: a Hall effect element; and a magnetoresistive element.

11. The apparatus of claim 8, further comprising a temperature-sensing device, wherein:
the controller is configured to detect a temperature of the apparatus by using the temperature-sensing device, and
the content of the second memory cell is copied into the register only when the temperature of the apparatus exceeds a predetermined threshold temperature.

12. The apparatus of claim 8, further comprising a second memory matrix, wherein the first memory matrix is configured to store user data, and the second memory matrix is configured to store factory data.

13. The apparatus of claim 12, further comprising:
a first row driver configured to control the first memory matrix;
a second row driver configured to control the second memory matrix; and
a row decoder configured to receive an address signal from the controller and provide at least a portion of the address signal to one of the first row driver and the second row driver based on a matrix identifier that is provided with the address signal.

14. The apparatus of claim 12, further comprising:
a voltage source;
a first row driver configured to control the first memory matrix,
a second row driver configured to control the second memory matrix, and
the switch is configured to receive a control signal from the controller and provide a voltage signal provided by the voltage source to one of the first row driver and the second row driver based on the control signal.

15. A method for use in a memory device of a sensor, the memory device including a first memory matrix, the sensor including a sensing element, a processing circuitry, the method comprising:
receiving, from the processing circuitry, a write request that is associated with a first memory cell, the first memory cell being part of the first memory matrix;
copying a content of a second memory cell into a register, the second memory cell being part of the first memory matrix;
erasing the first memory cell after the content of the second memory cell is copied into the register;

comparing the content of the second memory cell to a content of the register after the first memory cell is erased;

overwriting the second memory cell with the content of the register when the content of the second memory cell is different from the content of the register; and writing, to the first memory cell, at least a portion of data that is associated with the write request.

16. The method of claim 15, further comprising, wherein the first memory matrix includes an electrically erasable programmable read-only (EEPROM) matrix.

17. The method of claim 15, wherein the first and second memory cell are part of the same row of the first memory matrix.

18. The method of claim 15, wherein the content of the second memory cell is copied into the register only when a temperature of the first memory matrix exceeds a predetermined threshold temperature.

19. The method of claim 15, wherein the memory device includes a second memory matrix, the first memory matrix is controlled by using a first row driver, and the second memory matrix is controlled by using a second row driver, the method further comprising:

generating an address signal and supplying the address signal to row decoder; and routing, by the row decoder, at least a portion of the address signal to one of the first row driver and the second row driver, the routing being performed based on a matrix identifier that is provided with the address signal.

20. The method of claim 15, wherein the memory device includes a second memory matrix and a voltage source, the first memory matrix is controlled by using a first row driver, and the second memory matrix is controlled by using a second row driver, the method further comprising:

generating, by the voltage source, a voltage signal and providing the voltage signal to a switch;

generating, by the voltage source, a control signal and providing the control signal to the switch; and routing, by the switch, the voltage signal to one of the first row driver and the second row driver based on the control signal.

* * * * *

UNITED STATES PATENT AND TRADEMARK OFFICE
CERTIFICATE OF CORRECTION

PATENT NO. : 11,170,858 B2
APPLICATION NO. : 16/822119
DATED : November 9, 2021
INVENTOR(S) : Muhammad Sarwar et al.

It is certified that error appears in the above-identified patent and that said Letters Patent is hereby corrected as shown below:

In the Specification

Column 3, Line 45 delete ", and or" and replace with --, and/or--.

Column 6, Line 57 delete "signal from 176" and replace with --signal 176--.

Column 7, Line 41 delete "may configured" and replace with --may be configured--.

Column 7, Line 62 delete "156 be" and replace with --156 to be--.

Column 8, Line 29 delete "in used" and replace with --used in--.

Column 9, Line 38 delete "memory are cells" and replace with --memory cells--.

Column 10, Lines 58-59 delete "some the" and replace with --some of the--.

Column 11, Line 13 delete "solved." and replace with --sold.--.

In the Claims

Column 16, Line 4 delete "to row" and replace with --to a row--.

Signed and Sealed this
Fifteenth Day of August, 2023

Katherine Kelly Vidal
*Director of the United States Patent and Trademark Office*